United States Patent
Magnusen (10) Patent No.: US 7,634,242 B2
(45) Date of Patent: Dec. 15, 2009

(54) SYSTEMS AND METHODS FOR FILTER CENTER FREQUENCY LOCATION

(75) Inventor: Timothy M. Magnusen, Murphy, TX (US)

(73) Assignee: Microtune (Texas), L.P., Plano, TX (US)

( * ) Notice: Subject to any disclaimer, the term of this patent is extended or adjusted under 35 U.S.C. 154(b) by 456 days.

(21) Appl. No.: 11/513,550

(22) Filed: Aug. 31, 2006

(65) Prior Publication Data

US 2008/0057898 A1   Mar. 6, 2008

(51) Int. Cl.
H04B 1/26 (2006.01)
(52) U.S. Cl. .................................... 455/196.1; 455/307
(58) Field of Classification Search ............. 455/226.1, 455/260, 264, 265, 307, 196.1; 333/172–174; 331/100
See application file for complete search history.

(56) References Cited

U.S. PATENT DOCUMENTS

| | | | |
|---|---|---|---|
| 3,281,698 A | 10/1966 | Rose, Jr. et al. | |
| 3,626,285 A | 12/1971 | Hartke | |
| 5,204,972 A | 4/1993 | Hashimoto | |
| 5,973,633 A | 10/1999 | Hester | |
| 6,285,865 B1 | 9/2001 | Vorenkamp et al. | |
| 6,750,565 B2 | 6/2004 | Degen et al. | |
| 6,784,754 B1 | 8/2004 | Cheng | |
| 2002/0105331 A1 | 8/2002 | Brune et al. | |
| 2002/0126792 A1 | 9/2002 | Fuhrmann et al. | |
| 2003/0025563 A1* | 2/2003 | Christensen | 331/100 |
| 2003/0076139 A1 | 4/2003 | Miyagawa et al. | |
| 2005/0052225 A1 | 3/2005 | Cusinato | |

FOREIGN PATENT DOCUMENTS

| | | |
|---|---|---|
| EP | 1 282 227 A2 | 2/2003 |
| EP | 1 596 208 | 11/2005 |
| GB | 2 258 048 | 1/1993 |

OTHER PUBLICATIONS

International Search Report and Written Opinion issued for PCT/US2007/075677; Dated: Apr. 3, 2008; 17 Pages.
He X et al: "A 2.5-GHz Low-Power, High Dynamic Range, Self-Tuned Q-Enhanced LC Filter in SOI" IEEE Journal of Solid-State Circuits, IEEE Service Center, Piscataway, NJ, US, vol. 40, No. 8, Aug. 2005; 11 Pages.
Shaorui Li et al: "An integrated 1.5 V 6 GHz Q-enhanced LC CMOS filter with automatic quality factor tuning usig conductance reference" Radio Frequency Integrated Circuits (RFIC) Symposium, 2005. Digest of Papers. 2005 IEEE Long Beach, CA, USA Jun. 12-14, 2005, Piscataway, NJ, USA, IEEE, US, Jun. 12, 2005; 4 Pages.

(Continued)

Primary Examiner—Thanh C Le
(74) Attorney, Agent, or Firm—Fulbright & Jaworski L.L.P.

(57) ABSTRACT

A system for implementing a tuner comprising a Radio Frequency (RF) circuit, a filter disposed in a signal path in said RF circuit, a first negative resistance unit in communication with said filter adapted to cancel one or more resistive elements in said filter, a frequency measurement unit in communication with said filter, wherein said first negative resistance unit is adapted to cause said filter to act as an oscillator, and wherein said frequency measurement unit is adapted to measure oscillations of said filter and to calculate a center frequency of said filter therefrom.

18 Claims, 3 Drawing Sheets

OTHER PUBLICATIONS

U.S. Appl. No. 11/441,816, Stevenson et al.
U.S. Appl. No. 11/513,520, Stevenson et al.
U.S. Appl. No. 11/513,521, Stevenson et al.
International Search Report and Written Opinion issued for PCT/US2007/075671 dated Mar. 14, 2008, 10 pgs.
International Search Report and Written Opinion issued for PCT/US2007/075686 dated Apr. 17, 2008, 12 pgs.
U.S. Office Action issued for U.S. Appl. No. 11/513,521 dated Jan. 6, 2009, 18 pgs.
U.S. Office Action issued for U.S. Appl. No. 11/513,521 dated Jun. 26, 2008, 13 pgs.
U.S. Office Action issued for U.S. Appl. No. 11/513,520 dated Mar. 9, 2009, 6 pgs.

* cited by examiner

SYSTEMS AND METHODS FOR FILTER CENTER FREQUENCY LOCATION

CROSS-REFERENCE TO RELATED APPLICATIONS

This application is related to U.S. patent application Ser. No. 11/513,521, filed concurrently herewith, and entitled "SYSTEMS AND METHOD FOR DETECTING CAPACITOR PROCESS VARIATION," and to U.S. patent application Ser. No. 11/513,520, filed concurrently herewith, and entitled "RF FILTER ADJUSTMENT BASED ON LC VARIATION," the disclosures of which are hereby incorporated herein by reference.

TECHNICAL FIELD

This description relates, in general, to RF signal circuits, and, more specifically, to detecting the frequency response of one or more filters in an RF signal circuit.

BACKGROUND OF THE INVENTION

Signal tuner circuits include filters that remove one or more frequencies of a signal. Engineers often desire to know the center frequency of a given filter in a tuner circuit in order to determine if the filter itself is defective, should be adjusted, or if other components should be adjusted. This is especially true in semiconductor chip-based tuners, wherein semiconductor manufacturing variance may cause filters to have frequency characteristics that differ somewhat from their desired or predicted values.

One current technique to measure center frequencies of filters is to use circuitry that measures the phase shift that a signal experiences as it passes through a particular filter under test. There is a relationship between phase shift and center frequency, such that the phase shift information can be used to calculate an approximate filter center frequency. However, this is undesirable for multi-stage filters or circuits employing multiple filters. Since each stage of a multi-stage filter has its own frequency characteristics, a signal phase shift caused by the entire filter is not necessarily indicative of the phase shift that is caused by any one stage of the filter, especially when the effects of one filter stage tend to dominate the results, as is the case when one stage has a "zero" in its transfer function. Thus, it can be difficult to determine the center frequency of a given filter stage. Moreover, it is often impractical to measure the phase shift at each stage of a multi-stage filter because phase shift testing circuitry often tends to change the behavior of the filter being tested, thereby introducing error, and employing testing circuitry at each stage may introduce an unacceptable amount of error in the measurements. Further, since phase shift is closely related to time delay, phase shift measurements are often very sensitive to line length and parasitic capacitance effects, such that, even under good circumstances, such measurements can be error-prone.

Another current technique is to employ off-chip testing equipment to inject test signals into the tuner and capture the output of the tuner. The test equipment then calculates filter behavior based upon the tuner output. The disadvantages of this technique include the high cost of testing and the fact that such off-the-assembly-line-testing does not account for frequency response changes over the life of the tuner making subsequent and/or real-time adjustment impractical.

Yet another technique is to create an on-chip replica of a tuner filter or part thereof, subject it to testing, and calibrate the actual tuner filter based upon the results of the testing. However, this is expensive in terms of die space. No prior art solution provides accurate center frequency measurement of on-chip tuner filters at a lower cost and throughout the life of the tuner, especially for those tuners that include multiple filter stages.

BRIEF SUMMARY OF THE INVENTION

Various embodiments of the present invention are directed to systems and methods which provide filter center frequency measurement. In one example system, circuitry is implemented on the chip that causes the filter to act like an oscillator. Generally, the frequency response of a filter is a function of the inductance value, the capacitance, and the resistance in the filter. Usually, for filters the resistance is a positive number, and if the resistance is zero or negative, the filter behaves like an oscillator. Circuitry that applies negative resistance to the filter can cause the filter to oscillate. Thus, instead of filtering out signals, the filter creates its own signals at a frequency that is directly correlated to the center frequency of the filter after the negative resistance is applied. The filter center frequency can then be determined therefrom.

In multi-stage filters, the center frequency of each stage can be measured independently of the other stages by applying negative resistance to each stage separately. In one embodiment, each stage is connected to a separate negative resistance unit, while one frequency measurement unit is connected to the last cascaded stage. One-by-one, each of the stages is turned into an oscillator while its oscillations are counted by the frequency measurement unit. Downstream cascaded stages may attenuate the oscillating signal of an upstream stage, but it is still possible to measure the center frequency of any of the stages from frequency measurement circuitry at the last stage.

An advantage of some embodiments over the prior art external testing solution is that shifts in the center frequency of a filter throughout the life of the chip can be detected by rerunning the process. It is also generally faster and cheaper than using off-chip tester methods.

An advantage of some embodiments over prior art phase shift detection methods is that the center frequency of each of the stages of a multi-stage filter can be tested, often with a minimum of circuitry. This can provide a more precise view of the filter behavior and can also facilitate independent stage adjustment. Further, counting oscillations is generally less error-prone that detecting phase shifts, since downstream factors such as other filter stages, parasitic capacitance, line length, and the like often have minimal effect on the detection of cycles. Further, various embodiments do not employ filter replicas, thereby conserving die space.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
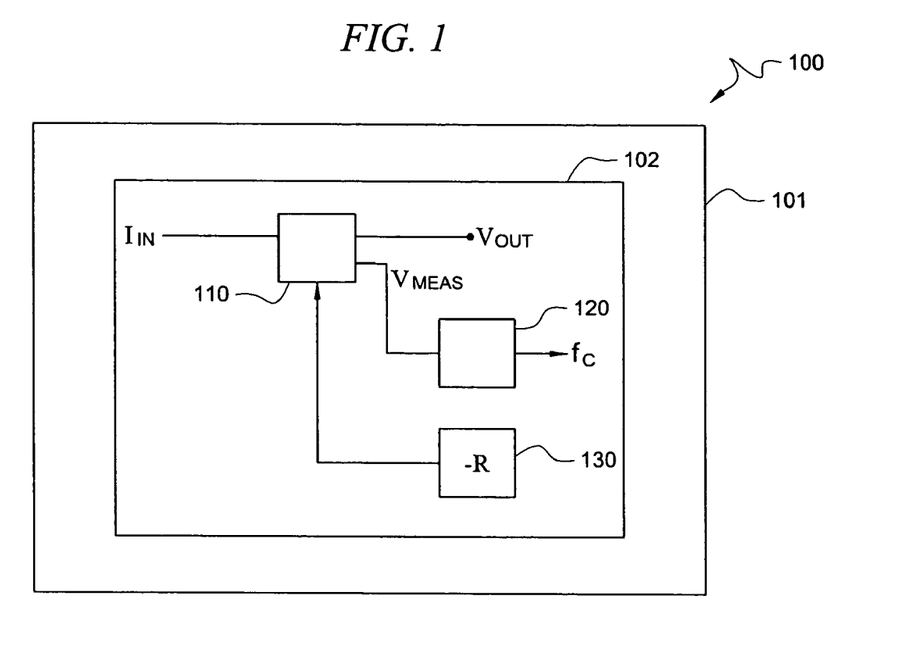
FIG. 1 is an illustration of an exemplary system adapted according to one embodiment of the invention.

FIG. 1 is an illustration of exemplary system 100 adapted according to one embodiment of the invention. System 100 includes semiconductor chip 101, upon which is disposed at least part of Radio Frequency (RF) circuit 102. One example of an RF circuit is a tuner for RF signals, though various embodiments are not limited thereto. While circuit 102 is shown disposed entirely upon chip 101, it should be noted that embodiments of the invention are not so limited. Various parts of the tuner may be located off-chip, including, for example, parts of filter 110. For convenience, only a portion of circuit 102 is shown. An example tuner that can be used as an RF circuit in some embodiments is described in U.S. patent application Ser. No. 11/441,816, filed May 26, 2006, and entitled "AGC SYSTEMS AND METHODS FOR BROADBAND TUNERS," the disclosure of which is hereby incorporated herein by reference.

In this example, filter 110 is an Intermediate Frequency (IF) filter in a signal path of circuit 102. Filter 110 outputs a signal, $V_{meas}$, to frequency measurement unit 120, which calculates filter center frequency, $f_c$, based thereon. Circuit 102 also includes negative resistance unit 130 that is adapted to apply negative resistance to filter 110, thereby causing filter 110 to act as an oscillator when unit 130 is enabled. As filter 110 oscillates, frequency measurement unit 120 is adapted to receive $V_{meas}$ and to generate information reflecting $f_c$. Control circuitry may be included (not shown) in some embodiments to enable negative resistance unit 130, enable a counter in frequency measurement unit 120, and receive the output of frequency measurement unit 120.

Figure 2:
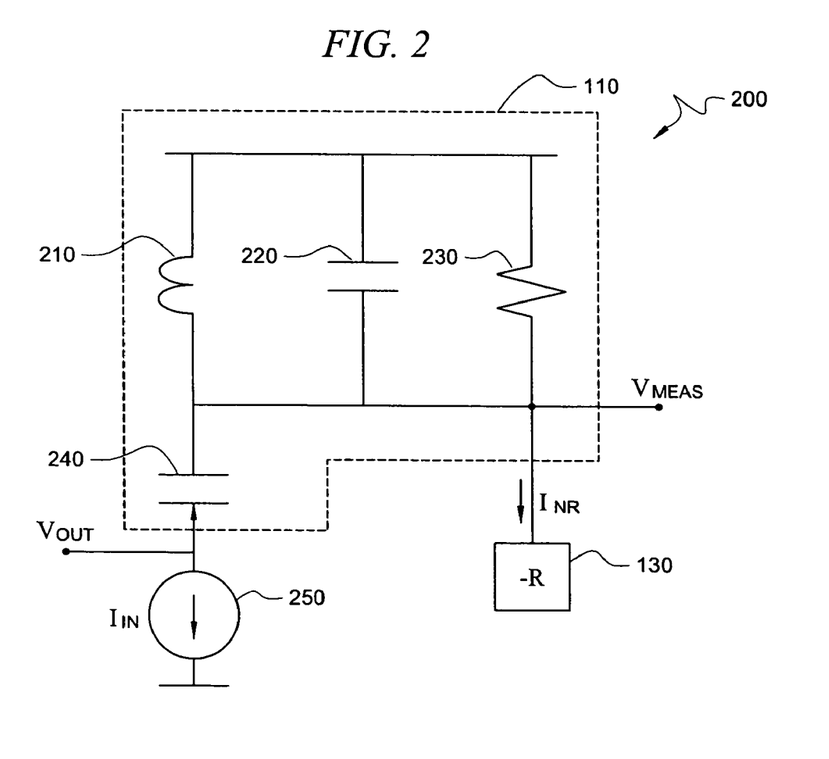
FIG. 2 is an illustration of an exemplary system adapted according to one embodiment of the invention.

FIG. 2 [put 200 in figures] is an illustration of exemplary system 200 adapted according to one embodiment of the invention. System 200 is an exemplary filter arrangement for use in system 100. System 200 includes inductor 210, capacitor 220, resistor 230, and series capacitor 240. Components 210, 220 and 230 make up the "tank" portion of filter 110, while 240 adds a zero in the transfer function of filter 110. Filter 110 converts $I_{in}$ to the output voltage $V_{out}$. The tank portion causes $V_{out}$ to be reduced at frequencies other than the desired. By adding a zero to the transfer function of filter 110, capacitor 240, in effect, acts an extra filter that causes $V_{out}$ to be reduced at a specific frequency. Input current 250 is coupled to filter 110 at "zero" capacitor 240, and $V_{out}$ is taken from the bottom of 240. $V_{meas}$ is taken from the node that connects inductor 210, capacitor 220, and resistor 230. Output current $I_{nr}$ feeds into negative resistance unit 130, and the magnitude of negative resistance increases as $I_{nr}$ increases. The invention is not limited to the filter arrangement of FIG. 2. For example, in embodiments wherein filter 110 does not include capacitor 240, $V_{meas}$ and $V_{out}$ can be the same signal. Such an arrangement is discussed in greater detail below.

Figure 3:
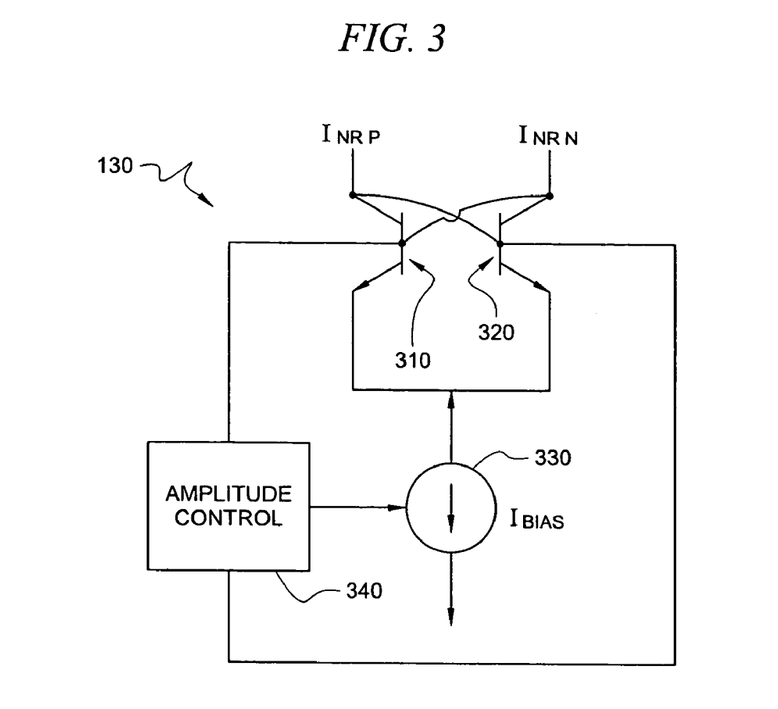
FIG. 3 is an illustration of an exemplary negative resistance unit that can be used in some embodiments of the invention.

FIG. 3 is an illustration of exemplary negative resistance unit 130 that can be used in some embodiments of the invention. In this example, unit 130 includes cross coupled bipolar junction transistors (BJTs) 310 and 320. BJTs 310 and 320 provide positive feedback, such that a signal that comes in gets amplified and output in phase, which is what gives unit 130 its negative resistance characteristic. The invention is not limited to cross coupled BJTs, as shown in FIG. 3. Various embodiments can include any active device that provides gain, including configurations of Field Effect Transistors (FETs).

In FIG. 3, current 330 is a bias current and it can be used to vary the amount of negative resistance that unit 130 provides. When the amount of negative resistance approaches a value equal in magnitude to the resistance of resistor 230 (FIG. 2), filter 110 behaves more like an ideal oscillator with its frequency at or near center frequency, $f_c$. As bias current 330 increases past the point whereat negative resistance just cancels resistance 230, it can add non-linear capacitance that can be difficult to account for, thereby introducing large signal effects that alter filter frequency measurements. Amplitude control unit 340 can be used to manage bias current 330, thereby keeping it in a range that minimizes unwanted non-linear effects while still providing oscillator behavior in filter 110. One example management technique is to keep $I_{bias}$ 330 close to the point whereat negative resistance just cancels resistance 230 by using feedback control techniques.

In many embodiments, amplitude control unit 340 does not know the value of resistor 230. However, the system can be designed to start out with $I_{bias}$ 330 that is high enough to cause negative resistance that is greater in magnitude than an upper limit of resistance 230. Filter 110 then oscillates with some amount of difference from its actual center frequency. Amplitude measurement unit 340 then measures the amplitude (voltage) of the filter 110 output and calculates a value for resistor 230 knowing the current ($I_{bias}$ 330) and amplitude. After the resistance value is calculated, amplitude measurement unit 340 decreases $I_{bias}$ 330 until the negative resistance and the value of resistor 230 are equal in magnitude. Iterative measurement and correction can be performed to ensure accuracy. Other techniques to adjust the value of $I_{bias}$ 330 may be used in various embodiments.

Figure 4:
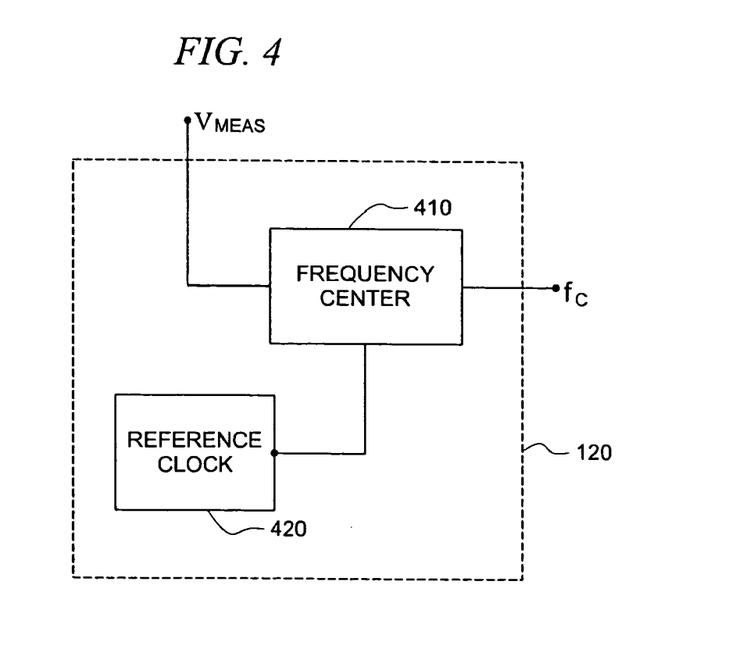
FIG. 4 is an illustration of an exemplary frequency measurement unit adapted according to one embodiment of the invention.

FIG. 4 is an illustration of exemplary frequency measurement unit 120 adapted according to one embodiment of the invention. $V_{meas}$ is output from filter 110 (FIG. 1) and is fed to frequency counter 410. Before a measurement is taken, frequency counter 410 is reset to zero or some other predefined value. When counter 410 is enabled, each cycle of $V_{meas}$ causes counter 410 to count up one. Cycles of reference clock 420 are used to define a measurement period wherein the counter is enabled. After a defined number of reference clock cycles, the counting is disabled, and the output of frequency counter 410 is digital bits which is a representing the oscillation frequency of filter 110.

In one example, when system 100 is initialized, unit 130 is turned on, frequency counter 410 is reset, and reference clock 420 is fed into counter 410. Time is allowed to pass for filter 110 to convert to an oscillator and stabilize. Then, frequency counter 410 starts to count the pulses coming out of filter 110. After a certain number of reference clock cycles, frequency counter 410 stops counting, and the output bits indicate the oscillation frequency of filter 410 when viewed in light of the measurement period. In some embodiments, a frequency divider may be used before the input of counter 410 in order to allow for lower-frequency counting. This may allow for use of a lower-frequency counter device and for lower power consumption without sacrificing accuracy. When the measuring process is done, negative resistance unit 130 is turned off and the frequency counter output information is stored, and filter 110 returns to normal operations.

As noted above, $V_{meas}$ is different from $V_{out}$ in the configuration shown in FIG. 2. This is because high-impedance measurement circuits (e.g., counter 410) may not accurately "see" the effects of capacitor 240 on the frequency response of system 200 if connected to filter 110 at $V_{out}$. For example, some measurement circuits simply see capacitor 240 as a DC block that has little or no effect on filter 110. In system 200, capacitor 240 increases the total capacitance beyond that attributable to capacitor 220 alone, thereby changing the frequency response of filter 110. There is a predictable effect of capacitor 240 in $V_{meas}$, and calculations can be performed to determine center frequency, $f_c$, from $V_{meas}$.

Various techniques can be used to compensate for the effects of 240 seen at $V_{meas}$. One technique is to preload frequency counter 410 with a number such that the final counter number reflects $f_c$. Another technique is to add or subtract from the counter number so that the sum (or difference) of the two numbers reflects $f_c$.

In some embodiments, counter 410 includes logic circuitry to change the counted number into a number that more directly indicates frequency. In one example, the counted number of cycles is divided by the time period for measurement. The result is an output in frequency units.

Figure 5:
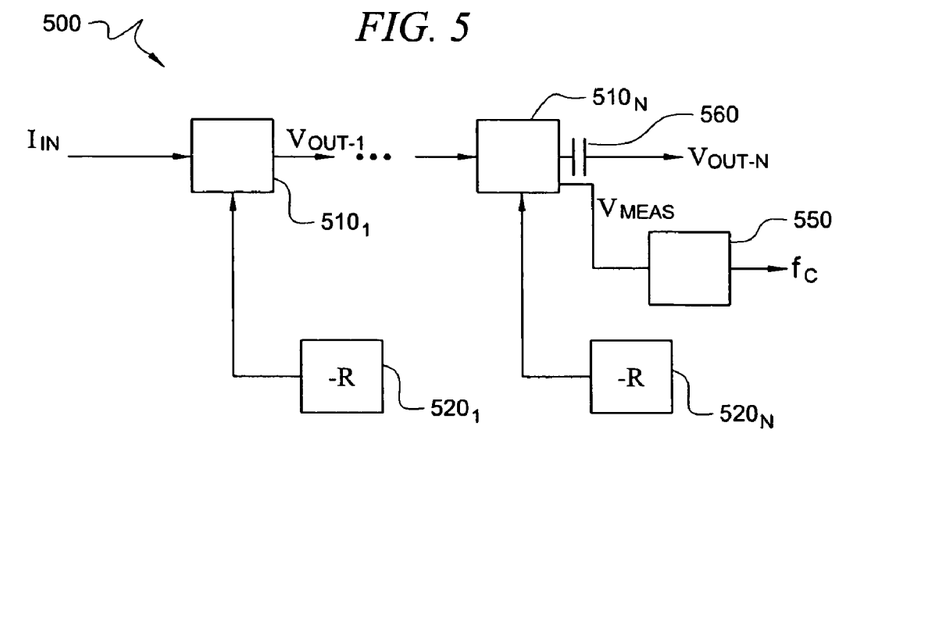
FIG. 5 is an illustration of an exemplary system adapted according to one embodiment of the invention.

Further in some embodiments, filter 110 (FIG. 1) includes two or more filter stages, wherein one or more of the filter stages can be designed to employ a series capacitor similar to capacitor 240. FIG. 5 is an illustration of exemplary system 500 adapted according to one embodiment of the invention. System 500 includes a multi-stage filter that employs cascaded filter stages 510-1 to 510-N. In this example, stages 510-1 through 510-(N−1) are similar in construction to filter 110 (FIG. 2) but lack series capacitors (such as capacitor 240). Some filters that omit capacitor 240 can measure $f_c$ at $V_{out}$. Thus, stages 510-1 through 510-(N−1) simply include $V_{out}$ signals. On the other hand, filter stage 510-N includes series capacitor 560 (arranged much like capacitor 240 of FIG. 2 to cause a "zero") and, thus, has $V_{out}$-N and $V_{meas}$. $V_{meas}$ feeds into frequency measurement unit 550. In some embodiments, the multi-stage filter converts current to voltage. Therefore, between each of the stages, there may be included a voltage to current conversion unit, e.g., another filter (not shown). Further, each filter stage can have a "zero" capacitor in it, such that the circuitry shown in FIG. 2 can be repeated in a cascaded fashion by including a voltage to current conversion unit between the stages.

Further, each stage 510 has its own negative resistance unit 520. However, in some embodiments, it is possible to have a single negative resistance unit that is switchably coupled to each of the stages, but such a switch may introduce unwanted measurement errors at higher frequencies. Thus, depending on the design, a system, such as system 500, may be more reliable and/or simpler to design to than one with a switchably-coupled negative resistance.

System 500 can be used to measure the frequency response of the multi-stage filter by measuring the center frequency of each stage 510. The results can be used, for example, to adjust tuner elements (e.g., adjusting one or more upstream filter elements 510 to match center frequencies with one or more downstream filter elements) by sending the results to a filter control system (not shown). Adjustable filter elements can include, for example, switchable inductors and/or capacitors. Additionally or alternatively, the results can be used to calculate a local oscillator frequency and/or a desired RF frequency so that other circuits in a signal path can be adjusted to optimize tuning, as described in U.S. patent application Ser. No. 11/513,520 filed concurrently herewith, and entitled "RF FILTER ADJUSTMENT BASED ON LC VARIATION."

An example technique to measure the center frequency of the filter of system 500 begins by enabling negative resistance unit 520-1 so that filter element 510-1 effectively becomes an oscillator. At the same time, remaining downstream filter elements 510-2 through 510-N stay in their normal operating modes. After filter element 510-1 reaches steady state and the amplitude of negative resistance unit 520-1 is adjusted to be optimal, frequency measurement unit 550 is enabled and counts the cycles of filter element 510-1 for a period, as described above. Frequency measurement unit 550 then performs calculations (if any) and sends it output, which reflects the center frequency of element 510-1, to another component (not shown).

Negative resistance unit 520-1 is disabled, and element 510-1 is allowed to return to its normal operating mode. The above-described operation is then repeated for the other stages through 510-N. In this way, the center frequencies for each of the stages 510 are measured.

An advantage of measuring the performance of the filter in system 500 by examining frequency rather than, e.g., phase or amplitude, is that, in some embodiments, frequency measurement circuitry (i.e., unit 550) may be placed only at the last stage. Downstream stages generally will not attenuate the oscillations of upstream stages past the point that they become unmeasurable by a counter. Thus, in system 500, unit 550 effectively measures the $V_{out}$ of each of upstream stages 510-1 through 510-(N−1) via $V_{meas}$. Of course, unit 550 measures the frequency of filter stage 510-N at $V_{meas}$ rather than its respective $V_{out}$. Since phase measurement usually depends on time delay, measurement of one stage through another stage is generally not possible.

As mentioned above, various configurations for multi-stage filters are possible. In another example wherein one or more of the intermediate stages 510-2 through 510-(N−1) has a "zero" (i.e., includes a "zero" capacitor similar to capacitor 240 of FIG. 2), a frequency measurement unit (such as unit 550) is placed at each one of such stages at a $V_{meas}$ output. In that case, each frequency measurement unit measures the center frequency for the stage that it is placed at and the non-zeroed stages between it and any upstream zeroed stage. In other words, such embodiments may include a frequency measurement unit at each zeroed stage, since "zero" capacitors cause effects that may best be measured at a $V_{meas}$ rather than at a $V_{out}$.

Many intermediate frequency filters in tuners are consistent with the examples shown in FIG. 5 in that they include two or three stages, wherein the last stage has a zero in its transfer function, and it is possible to implement a measuring system according to one or more embodiments of the invention using various filters currently on the market. However, it should be noted, that various embodiments are not limited to the configuration shown in FIG. 5, such that some embodiments may include one or more frequency measurement units at any given stage in a particular filter. Further, the concepts discussed above with regard to multi-stage filters may be applied to some systems that cascade filters. Thus, in one example embodiment that has a first IF filter that sends a signal to a mixer that sends a signal to a second IF filter, the two IF filters may be oscillated and their center frequencies detected much like the filter stages shown in FIG. 5. While the mixer may affect the frequency that is detected, its effect should be accurately predictable, allowing it to be compensated for.

Figure 6:
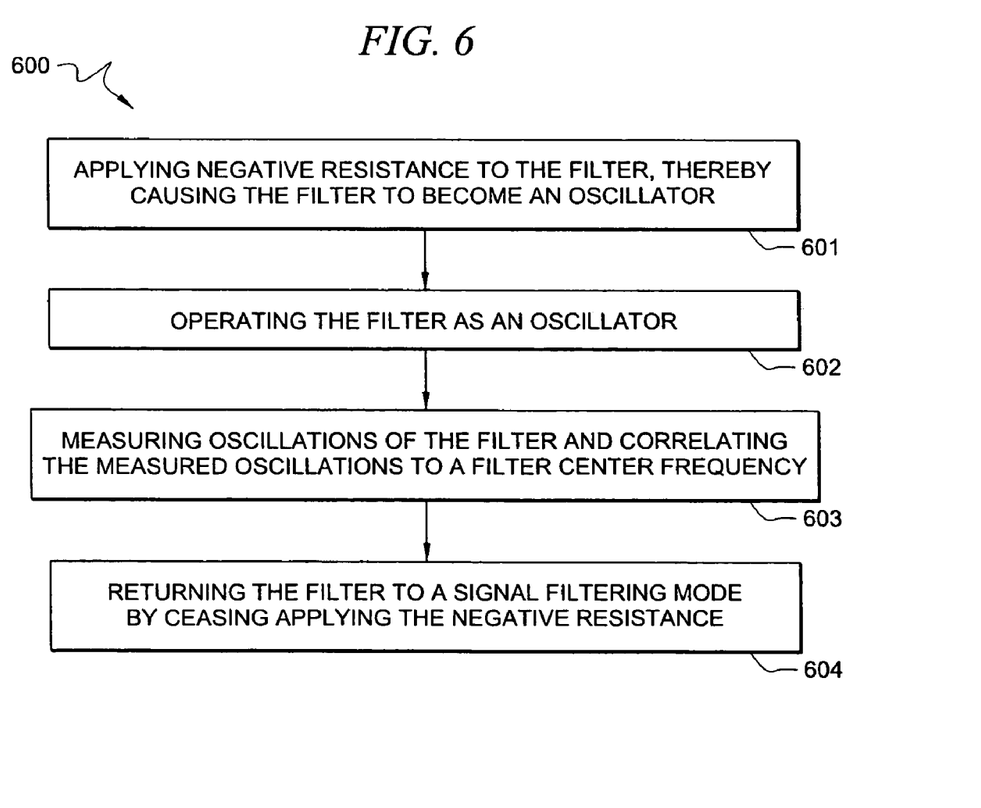
FIG. 6 is an illustration of an exemplary method adapted according to one embodiment of the invention.

FIG. 6 is an illustration of exemplary method 600 adapted according to one embodiment of the invention. Method 600 is a technique for measuring a frequency response of a filter in a signal path of a tuner, and may be performed, for example, by a control system implemented in hardware or software. In one example, the filter is an IF filter in the tuner; however, embodiments of the invention may be used to measure the frequency response of any kind of filter in a signal path of a tuner. In step 601, negative resistance is applied to the filter, thereby causing the filter to become an oscillator. In one example, negative resistance is applied to cancel a resistive portion of the filter. The negative resistance may be applied, for example, by enabling a gain element so that the gain element causes bias current to be applied to the filter. Applying negative resistance can also include, in some embodiments, maintaining the bias current at a level that cancels the resistive portion of the filter through feedback control (as described above with regard to FIG. 3).

In step 602, the filter is operated as an oscillator. In some embodiments, this step includes waiting an amount of time after the negative resistance is applied for the bias current and the filter to settle.

In step 603, the oscillations of the filter are measured, and the measured oscillations are correlated to a filter center frequency. In some embodiments, this step includes incrementing a counter with each oscillation of the filter for a predetermined time period. Then the number of counted oscillations are divide by the length of the time period to yield an output in frequency units. However, in some embodiments, the correlating includes accounting for effects that are known to cause measurement error. For example, when a filter has a capacitor in series with its inductive capacitive tank (e.g., capacitor 240 of FIG. 2), it may be provided with an output that is not in series with the "zero" capacitor. Signals from that output will then reflect an effect of the "zero" capacitor. When the effect of the "zero" capacitor is known, logic circuitry can be used to compensate for the effect. In one example, the counter is preloaded with a value that offsets the effect. In another example, mathematical algorithms are executed that cancel the effect from the final output.

The step can also include outputting a signal indicative of the center frequency. It should be noted that the output can be digital or analog and can be produced in a variety of ways, as long as the output can be received and the center frequency can be determined therefrom. The output can be used for a variety of functions, such as testing, adjusting the filter, itself, or adjusting other tuner components to accommodate the filter.

In step 604, the filter is returned to a signal filtering mode by ceasing applying the negative resistance. In some embodiments, this step includes disabling the gain element described above.

While method 600 is illustrated as a series of sequential steps, some embodiments of the invention are not so limited. For instance, in some embodiments, step 604 may be performed before or simultaneously with step 603. Moreover, method 600 may be performed for each stage of a multi-stage filter, such that the frequency response can be individually measured Further, in various embodiments, method 600 can be performed at any time, including at power-up of the tuner, during operation of the tuner (although tuner operation will be paused while the filter(s) oscillate), during manufacturing testing, and the like.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for implementing a tuner, said system comprising:
 a Radio Frequency (RF) circuit;
 a filter disposed in a signal path in said circuit;
 a first negative resistance unit in communication with said filter adapted to cancel one or more resistive elements in said filter, wherein said first negative resistance unit is adapted to cause said filter to act as an oscillator; and
 a frequency measurement unit in communication with said filter, wherein said frequency measurement unit is adapted to measure oscillations of said filter and to generate a number indicative of a center frequency of said filter therefrom, wherein said filter is a first filter element, said system further comprising a second filter element cascaded from said first filter element and in communication with a second negative resistance unit, wherein said second negative resistance unit is adapted to cause said second filter element to act as an oscillator, and wherein said frequency measurement unit is adapted to measure oscillations of said second filter element and to generate a number indicative of a center frequency of said second filter element therefrom.

2. The system of claim 1 wherein said RF circuit is a tuner, and wherein said filter is an Intermediate Frequency (IF) filter.

3. The system of claim 1 wherein said second filter element comprises an inductive capacitive portion and a capacitor in series with said inductive capacitive portion, thereby creating a zero in a transfer function of said second filter element.

4. The system of claim 3 wherein said second filter element includes an output terminal that is not in series with said series capacitor, said output terminal connected to said frequency measurement unit.

5. The system of claim 1 further including a control system in communication with said frequency measurement unit adapted to adjust a response of said filter based at least in part upon said calculated center frequency.

6. A system for implementing a tuner, said system comprising:
 a Radio Frequency (RF) circuit;

a filter disposed in a signal path in said circuit;

a first negative resistance unit in communication with said filter adapted to cancel one or more resistive elements in said filter, wherein said first negative resistance unit is adapted to cause said filter to act as an oscillator; and a frequency measurement unit in communication with said filter, wherein said frequency measurement unit is adapted to measure oscillations of said filter and to generate a number indicative of a center frequency of said filter therefrom, wherein said filter comprises an inductive capacitive portion and a capacitor in series with said inductive capacitive portion, thereby creating a zero in a transfer function of said filter, and wherein said frequency measurement unit includes logic circuitry adapted to count a number of oscillations of said filter during a measurement period and to generate a number indicative of said center frequency therefrom, accounting for an effect of said series capacitor.

7. The system of claim 1 wherein said negative resistance element comprises cross coupled transistors in communication with an amplitude control unit, said amplitude control unit adapted to maintain an amplitude of said negative resistance to cancel said resistive element.

8. The system of claim 1 further comprising:

a semiconductor chip with at least part of said RF circuit included thereon, and wherein said first negative resistance unit is disposed on said chip.

9. A method for measuring a frequency response of a filter in an RF circuit, said method comprising:

applying negative resistance to said filter, thereby causing said filter to become an oscillator, wherein said filter is in a signal path of said RF circuit;

operating said filter as an oscillator;

returning said filter to a signal filtering mode by ceasing applying said negative resistance;

measuring oscillations of said filter and correlating said measured oscillations to a filter center frequency; and outputting a signal indicative of said filter center frequency, wherein said filter is a first filter element, said RF circuit further comprising a second filter element cascaded from said first filter element, said method further comprising:

applying negative resistance to said second filter element, thereby causing said second filter element to act as an oscillator; and measuring oscillations of said second filter element and correlating said measured oscillations to a second filter element center frequency.

10. The method of claim 9 wherein said RF circuit is a chip-based RF tuner, wherein said wherein said filter is disposed, at least in part, on said chip, and wherein said negative resistance is applied from a component on said chip.

11. The method of claim 9 wherein said second filter element comprises an inductive capacitive portion and a capacitor in series with said inductive capacitive portion, thereby creating a zero in a transfer function of said second filter element.

12. The method of claim 11 wherein said second filter element includes an output terminal that is not in series with said series capacitor, said output terminal connected to a frequency measurement unit.

13. The method of claim 9 wherein said applying negative resistance comprises:

controlling a gain element to produce a bias current to said filter, thereby maintaining said negative resistance at a magnitude that cancels a resistive element in said RF circuit.

14. A method for measuring a frequency response of a filter in an RF circuit, said method comprising:

applying negative resistance to said filter, thereby causing said filter to become an oscillator, wherein said filter is in a signal path of said RF circuit;

operating said filter as an oscillator;

returning said filter to a signal filtering mode by ceasing applying said negative resistance;

measuring oscillations of said filter and correlating said measured oscillations to a filter center frequency; and outputting a signal indicative of said filter center frequency, wherein said filter comprises an inductive capacitive portion and a capacitor in series with said inductive capacitive portion, thereby creating a zero in a transfer function of said filter, and wherein said measuring oscillations of said filter comprises:

preloading a value into a cycle counter; and incrementing said cycle counter with each oscillation of said filter, thereby compensating for an effect of said series capacitor.

15. The method of claim 9 further comprising:

adjusting a performance of said filter based upon said measuring.

16. The method of claim 9 wherein said output signal indicates a number of said oscillations in a defined time period.

17. A system for measuring a frequency response of a filter in a semiconductor chip-based tuner, wherein said filter is disposed, at least in part, on said chip, said system comprising:

means for applying negative resistance to said filter, thereby causing said filter to become an oscillator, wherein said filter is in a signal path of a semiconductor chip-based tuner;

means for measuring oscillations of said filter and correlating said measured oscillations to a filter center frequency; and means for returning said filter to a signal filtering mode by ceasing applying said negative resistance;

wherein said filter comprises:

an inductive capacitive portion and a capacitor in series with said inductive capacitive portion, thereby creating a zero in a transfer function of said second filter element; and an output not in series with said series capacitor, wherein said measuring means is in communication with said output.

18. The system of claim 17 further comprising:

means for maintaining said negative resistance at a magnitude that cancels a resistive element in said tuner.

* * * * *

UNITED STATES PATENT AND TRADEMARK OFFICE
CERTIFICATE OF CORRECTION

PATENT NO.        : 7,634,242 B2
APPLICATION NO. : 11/513550
DATED             : December 15, 2009
INVENTOR(S)       : Timothy M. Magnusen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 562 days.

Signed and Sealed this

Ninth Day of November, 2010

David J. Kappos
*Director of the United States Patent and Trademark Office*